(12) United States Patent  
Shun'ko

(10) Patent No.: US 6,710,333 B2  
(45) Date of Patent: Mar. 23, 2004

(54) PROCESS FOR STRUCTURAL MODIFICATION OF SURFACES BY TREATMENT WITH AN ATOMIC OR MOLECULAR GASEOUS MEDIUM EXCITED TO METASTABLE LEVEL

(75) Inventor: Evgeny V. Shun'ko, Ypsilanti, MI (US)

(73) Assignee: Wintek Corporation, Taichung (TW)

( * ) Notice: Subject to any disclaimer, the term of this patent is extended or adjusted under 35 U.S.C. 154(b) by 2 days.

(21) Appl. No.: 10/352,079

(22) Filed: Jan. 27, 2003

(65) Prior Publication Data

US 2004/0012320 A1 Jan. 22, 2004

Related U.S. Application Data

(63) Continuation-in-part of application No. 10/192,329, filed on Jul. 10, 2002.

(51) Int. Cl.$^7$ .................................................. H05H 3/00
(52) U.S. Cl. .................. 250/251; 250/492.1; 250/492.2; 250/374; 315/111.01; 315/111.21
(58) Field of Search .............................. 250/251, 492.1, 250/492.2, 374; 315/111.01, 111.21

(56) References Cited

U.S. PATENT DOCUMENTS

2001/0055649 A1 * 12/2001 Ogure et al. ............. 427/248.1

* cited by examiner

*Primary Examiner*—Nikita Wells
(74) *Attorney, Agent, or Firm*—Carothers and Carothers

(57) ABSTRACT

A process for modification of a surface structure by exposing the surface to a flow of neutral atomic or molecular gaseous medium excited to metastable level which is produced in a process of blowing a working gaseous medium through a discharge gap filled with plasma generated from this working gaseous medium.

5 Claims, 2 Drawing Sheets

PROCESS FOR STRUCTURAL MODIFICATION OF SURFACES BY TREATMENT WITH AN ATOMIC OR MOLECULAR GASEOUS MEDIUM EXCITED TO METASTABLE LEVEL

CROSS REFERENCE

This application is a continuation-in-part of application Ser. No. 10/192,329, filed Jul. 10, 2002 for RF LOADED-LINE TYPE CAPACITIVE PLASMA SOURCE FOR BROAD RANGE OF GAS PRESSURE.

FIELD OF INVENTION

The present invention relates to plasma processing technology. In particular the invention pertains to treatment of surfaces by a flow of plasma produced atomic or molecular medium excited to metastable level to clean the surfaces from undesirable contaminating residues, to improve surface adhesive bonding, to provide surface sterilization, or to modify selectively the chemical and crystalline structure of the surface treated for semiconductor, display, micromachining, and medical related technologies.

BACKGROUND OF THE INVENTION

There exists a plurality of methods of plasma treatment of solid surfaces for the purpose of cleaning, etching, and enhancing these surfaces. Within these methods, the plasma cleaning technologies form a separate group of treatments. Within this separate group there is a distinctive difference between passive plasma cleaning processes, when the surfaces treated are exposed passively to plasma or its products, and active ones, when the surfaces treated interact as electrically biased electrodes with charged components of plasma (electrons and ions). A description and a classification of plasma cleaning processes is presented in "Industrial Plasma Engineering", Vol. 2, Applications to Nonthermal Plasma Processing, by J. Reece Roth, Institute of Physics Publishing, 2001, p.p. 341–359. The present invention relates closely to the passive plasma cleaning processes. More specifically, it relates to surface modification processes provided by a neutral long living metastable component excited in plasmas of a working gaseous medium As it is well known from gas discharge laser technology, a significant concentration of excited atoms or molecules of the working gas can be achieved in gas discharge plasmas and used as an active medium for laser generation, see for example: "Kinetic Processes in Gases and Molecular Lasers" by B. F. F. Gordiets, A. I. Osipov, L. A. Shelepin, Gordon & Breach Publishing Group, 1988. The long living metastable states of the electrons in the atoms (or molecules) can exist due to high quantum symmetry of these metastable states provided by atomic (or molecular) electron configuration. Since interaction of the excited atoms (or molecules) with a surface violates this symmetry, the energy of excitation is liberated (with a final electron transition to ground level) and is absorbed in the surface of the solid with significant probability. This effect of originating an anomalous thermo-conductivity in gases of gas discharge lasers is described in a paper by E. V. Shun'ko: "Some features of power balance in gas discharge in $CO_2$, $N_2$, and their mixtures with He", J. Appl. Phys., 70(12), 1991, p.p. 7273–7281.

1. Thus the atoms (or molecules) excited to metastable level can be utilized for modification of the surfaces of the solids.

2. The complete electron transition energy to ground level for certain metastable excited atoms can achieve the value ~15 eV which is enough to destruct structural bonds in the surface of the work piece and increase in this manner the surface energy above 70 erg/cm² (surface tension of water at the room temperature) improving surface adhesive bonding significantly.

3. The relatively high energy ~15 eV, which can be liberated from each electron transition in the process of metastable atom relaxation on the surface, enables one to form the free radicals in a biomaterial contaminating the surface that provides in this manner a surface sterilization.

4. Choosing necessary operating gas or gas composition within available gases and vapors, and choosing in this manner a necessary energy of the operating metastable level, one can selectively induce or disintegrate chemical bonds of the material coating the surface.

5. The possible long life time of $\tau_m > 0.001$ sec (for example) realized for the metastable state of some kinds of atoms or molecules enables one to separate excited atoms from plasma by blowing operating gas through a discharge gap with the average flow velocity of $v_g > 10$ m/s, providing a physical disconnection of the operating gas saturated with the excited atoms from a plasma boundary at the distance $d = v_g \times \tau_m > 1$ cm. This disconnection provides the possibility for a soft surface cleaning avoiding destructive direct contact of plasma with patterns developed on the surfaces treated for semiconductor, display (Indium-Tin-Oxide), and micromachining technology.

The process of modification of the surface by its exposure to a flow of metastable atoms (molecules) mixed with a neutral gas and plasma can be realized with RF Capacitively Coupled Plasma (CCP) sources described in "Industrial Plasma Engineering", Vol. 1, Principles, J. Reece Roth, Institute of Physics Publishing, 1995, p.p. 417–463. As seen in FIG. 12.12, page 443 of this book (see FIG. 1 of the present disclosure), a plasma source with outer ring type electrodes 2 and 3 is mounted outside of a quartz wall (or ceramic) tube 1 serving as a plasma reactor is one of the possible RF plasma sources applicable for metastable excited atomic (molecular) medium generation. This arrangement of the electrodes enables one to avoid plasma contamination with an electrode material affecting in general the life time of the metastable medium. The operating gas (or gas composition) required for such a process is fed to one of the ends of the tube 1 under necessary pressure, whereby, at the supply of RF power to said electrodes 1 and 2 at a frequency of 1 to 100 MHz, plasma 4 mixed inside the tube 1 with neutral gas and neutral metastable atoms (molecules) spreads along this tube due to the electromagnetic field action and causes a gas flow through the inter-electrode space to contact with a work piece 5 and to deliver in this manner to the work piece 5 surface the excited metastable atomic (molecular) medium produced from the operating gas (or gas composition).

A process of surface modification can be provided by static exposure of the work piece 5 surface to a flow of a working mixture of plasma with a neutral gas and an excited atomic (molecular) medium during a certain exposure time $\tau_{ex}$, or by moving the work piece with a constant velocity $v_w$ under the flow of this mixture that assumes the exposure time defined by the equation $\tau_{ex} = a/v_w$, where a is the diameter of the mentioned beam, see FIG. 1.

However a practical application of the RF source type presented in FIG. 1 for production of an excited to metastable state medium separated from plasma has problems. A combined plasma electrode configuration forms a typical dipole antenna propagating the electromagnetic field in surrounding space (as is seen in FIG. 1). This propagation promotes in turn plasma spread along the tube 1 to distances of several inter-electrode lengths. As a result, the plasma has a natural slow decrease in density outward from the source electrodes 2 and 3. Therefore at distance $l_w$ where this density is negligibly small and undesirable RF-arc breakdown from plasma to the surface of the workpiece becomes completely impossible, the density of the excited metastable medium (having a limited life time) produced by a weak plasma wing is negligible as well. To improve the output density of the excited metastable medium without jeopardizing the surface to be treated to RF-arc breakdown, one can increase the velocity of gas flow through the tube 1. However increasing gas velocity is very costly for an industrial process provided with operating gases having a relatively high price.

It is clear that the best way to increase the output density of the metastable excited medium is to form a clear cut sharp boundary of high density plasma downstream. Then at a distance safe for RF breakdown between the plasma boundary and the workpiece surface, one can realize a maximum possible excited metastable medium density provided by this close distanced high density plasma. To form the sharp plasma boundary at the metastable excited medium outflow, a propagation of the RF electromagnetic field should be cut sharply in the vicinity of the output electrode 3. This sharp cut of the electromagnetic field propagation is provided reliably in a device configuration described in a US Patent Application entitled RF LOADED-LINE TYPE CAPACITIVE PLASMA SOURCE FOR BROAD RANGE OF OPERATING GAS PRESSURE, application Ser. No. 10/192,329, Filed Jul. 10, 2002, see FIG. 2 of the present disclosure. In FIG. 2, an operating tube 1 of a high temperature insulator (quartz, ceramic) passes through a high voltage ring or collar type electrode 2 and further through a collar type grounded electrode 3 extended to form an outside cylindrical shield 7 enveloping coaxially the inner part of the operating tube 1 and the high voltage electrode 2. The outside cylindrical shield 7 is flanged, and the high voltage electrode 2 is mounted with this flange 7a by a cylindrical insulator 9. All the connections of the operation tube 1 with the electrodes 2, 3, the connections of the flange 7a with the cylindrical shield 7 and the insulator 9, as well as the connection of the insulator 9 with the high voltage electrode 2, are sealed by corresponding O-rings shown in FIG. 2 as solid black cross sections. To ignite the device, the special igniting electrode 6 is mounted at the output end of the operating tube 1. An RF power supply is connected with the device by a coaxial cable 11 and further by a water cooled conductive clamp 10 providing cooling of the high voltage electrode 2 Cooling of the grounded electrode 3 and the outside cylindrical shield 7 is provided by a water passage or conduit in their common body. A gaseous working composition is supplied via an end of the operating tube 1 from the high voltage electrode 2 side, and an excited to metastable state gaseous medium 4a produced by plasma 4 as generated by RF power applied between the electrodes 2 and 3 yields from the opposite end of the operating tube 1 with a gas flow in contact with a workpiece 5. The interior cavity 8 formed between the inner surface of the shield 7, the outer surfaces of the electrodes 2, 3 and the operating tube 1, and the inner surface of the flange 7a and the insulator 9, is filled through a pipe 12 with a special gas composition under a necessary pressure (or with a corresponding oil) to prevent RF discharge outside the operating tube 1, e.g. in the interior cavity 8. It is understood that for any reasonable pressure and gas (vapor) composition feeding the RF discharge plasma in operating tube 1, one can find a suitable medium along with its required pressure for filling interior cavity 8 to prevent direct RF breakdown between the electrodes 2 and 3. Intensive cooling of the outer surface of the operating tube 1 in the cavity 8 can be provided with application of an additional pipe, similar to pipe 12, installed at a proper place and connected in common with the pipe 12 to a heat exchanger if necessary.

The device embodiment shown in FIG. 2 is a terminating portion of the RF coaxial loaded line source where the high voltage electrode 2, plasma beam 4, and the inner part of the electrode 3 forms a core of this coaxial line. Therefore an electromagnetic field of this coaxial line exists only inside the cavity 8 at the proper connection of the RF power supply cable 11 to the device. In practice, plasma generated in the tube 1 of this device forms a clear cut sharp boundary shifted downstream from the grounded electrode 3 lower surface to a 2-3 tube diameter distance, depending on the RF power absorbed in plasma (cf. 2-3 inter-electrode distances for the device shown in FIG. 1).

A process for surface modification with application of the device shown in FIG. 2 can be provided by statically exposing the work piece 5 surface to a flow of an excited atomic (molecular) medium during a certain exposure time $\tau_{ex}$, or by moving a work piece with the constant velocity $v_w$ under the flow of this medium that assumes the exposure time defined by the equation $\tau_{ex}=a/v_w$, where a is the diameter of a spot formed by the yielded flow on the surface treated, see FIG. 2.

OBJECTS OF THE INVENTION

It is an object of the present invention to provide a process of surface modification by exposing it to a flow of neutral atoms or molecules produced in plasmas excited to a metastable level. Another object of the invention is to provide a process of cleaning the surfaces without destruction of patterns built on the surfaces for semiconductor, display, or micromachining technologies. It is also an object of the invention to provide a process of selective modifications in thin surface layers of solids for the purpose of developing an adhesion bonding, sterilization or selective chemical and crystalline structure transformation of the surface by application of a specially chosen working gaseous medium having a certain required value of atom excitation energy.

SUMMARY OF THE INVENTION

The process of surface modification of the present invention is provided by exposing the surface to excited metastable atoms (or molecules) flowing to the surface being treated from a source of these atoms (or molecules).

To provide the certain selective surface modification process of the present invention, one can choose a gas or vapor with the required value of a metastable level energy within a variety of available metastable levels of existing gases and vapors.

To produce the excited metastable atoms (or molecules) for the surface modification process, the working gas medium is blown preliminary through a discharge gap filled with plasma generated of or from this gas medium.

To provide nondestructive cold surface modification or a corresponding cleaning process, an excited metastable atomic (or molecular) component is separated from plasma by shifting it from a plasma boundary to a distance d where a surface to be treated is located. A flow velocity $v_g$ of the gas medium throughout the discharge gap and further toward the surface being treated is set in this case to the value defined by the expression: $v_g \geq d/\tau_m$, where $\tau_m$ is the life time of the working metastable level.

To provide the necessary energy and concentration of electrons in plasmas for effective excitation of a chosen metastable electron level of a primary operating gas, the binary or triple gas composition is developed, wherein secondary gases control key parameters of the gas discharge plasma.

An operating medium (gaseous or vapor) required for a specific process has a pressure from several mTorr to several atmospheric pressures. The density of electric power applied to plasma for an operating component excitation has a rating from tens of $W/cm^3$ to 1000 $W/cm^3$.

BRIEF DESCRIPTION OF THE DRAWINGS

Other objects and advantages are presented in the following description and claims. The appended drawings show, for purpose of illustration, without limiting the scope of the invention or claims, certain practical embodiments of the invention, wherein:

DETAILED DESCRIPTION OF A PREFERRED EMBODIMENT OF THE PROCESS OF THE PRESENT INVENTION

Figure 1:
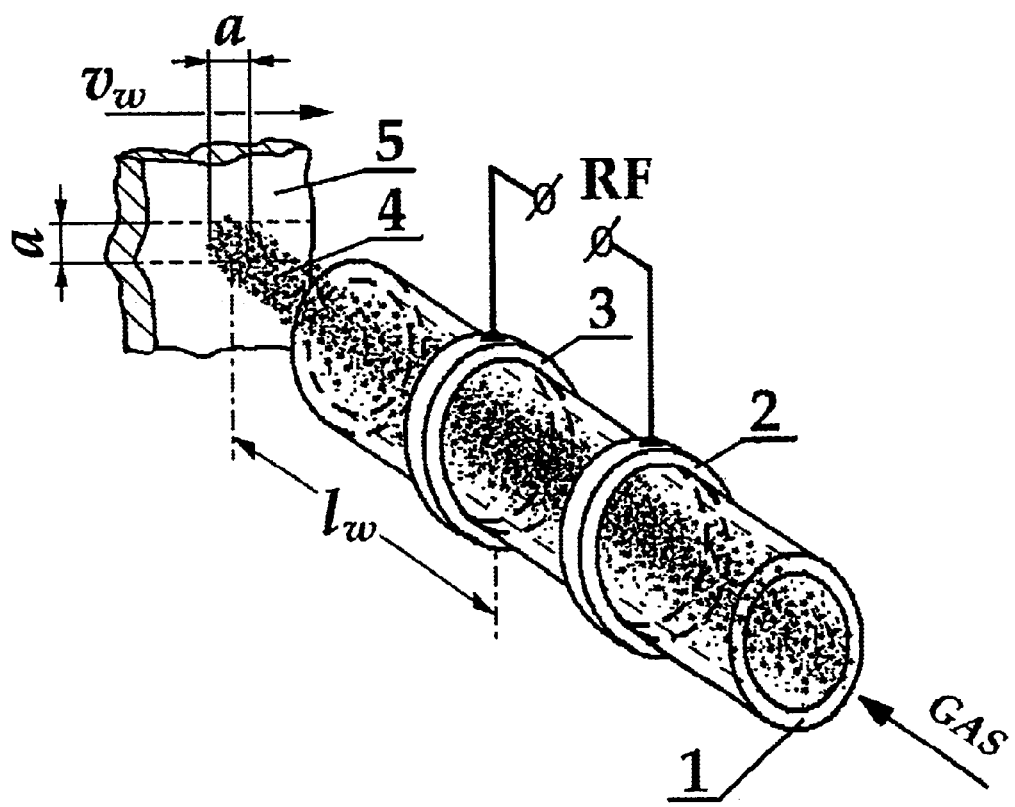
FIG. 1 is a prior art schematic diagram showing a surface treatment process provided with an RF Capacitively Coupled Plasma (CCP) source having collar electrodes placed outside the insulating wall of an operating tube.
Figure 2:
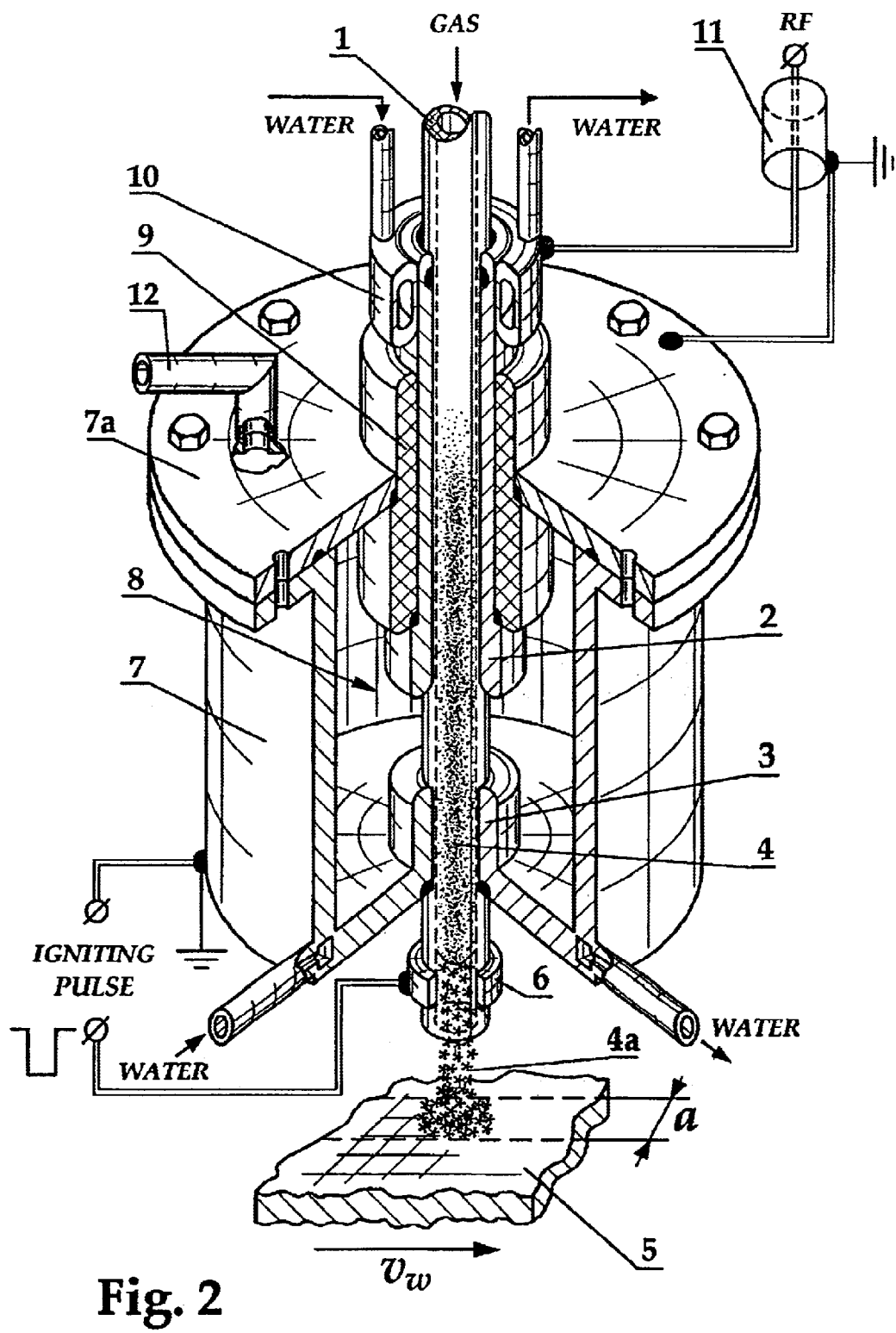
FIG. 2 is a schematic diagram showing the surface treatment process of the present invention provided with a metastable neutral component flow generated by an RF loaded-line type capacitive plasma source.

The process of surface modification of the present invention by an atomic or molecular medium excited to a metastable state is shown in FIG. 2. This view illustrates a process of gas excitation to metastable state by plasma generated in the RF loaded-line type capacitive plasma source presented in this figure in three dimensional partial sectional view. In this view, a working gaseous composition feeds the source via the upper end of the operating tube 1, passes through plasma 4 and yields a medium excited to a metastable state produced by interaction of the working gaseous composition with plasma generated of or from this composition in a discharge gap formed between collar type electrodes 2 and 3 supplied with RF power. The average velocity $v_g$ of the gas and excited medium output flow is chosen for this process in correspondence with the formula:

$$v_g \geq d/\tau_m, \quad (1)$$

where d is the distance set between a plasma boundary and a workpiece 5 surface, and $\tau_m$ is the life time of the chosen working metastable level. The distance d is chosen experimentally as a distance at which RF-arc discharge from the plasma boundary to a surface of a work piece 5 is not a possible reliable number. In practice, its value varies in a range of 1 cm<d<2 cm. The velocity of the workpiece $v_w$ is defined technologically by requirements for the surface properties after treatment and its value is in the range of 0.1 cm/s<$v_w$<10 cm/s depending on the process particulars selected.

The process surface cleaning of the present invention is a process of surface modification to improve its adhesive bonding, and sterilization, by being excited to a metastable state $2s^2 2p^3(^4S^*)4d$, term $^3D^*$, $J_k$=3, $g_k$=7, and neutral atomic oxygen is provided in cooperation with an apparatus shown in FIG. 2 as well, where a gas mixture of 98% argon (Ar) and 2% molecular oxygen ($O_2$) feeds the source via the upper end of the operating tube 1, passes throughout plasma 4 generated from this mixture, and yields a mixture of 98% argon (Ar), ~4% neutral atomic oxygen (O) excited to the state $2s^2 2p^3(^4S^*)4d$, term $^3D^*$, $J_k$=3, $g_k$=7, and an insignificant percentage of molecular oxygen ($O_2$). The life time of the metastable state $2s^2 2p^3(^4S^*)4d$, term $^3D^*$, $J_k$=3, $g_k$=7, for atomic oxygen is $\tau_m$=0.00103 sec (for reference purposes see Website: http://physlab2.nist.gov/cgi-bin/AtData/display.ksh), and consequently one can obtain the distance d=1 cm from the plasma boundary to the workpiece surface at the output gas velocity of $v_g$=1000 cm/s, see the equation (1). This is a completely acceptable value allowing a laminar character of a gas flow throughout the operating tube 1 of several millimeters or more in inner diameter. RF power of 13.65 MHz of a standard frequency is applied to the electrodes 2 and 3 for plasma generation with power density contributed in plasma $\geq$100 $W/cm^3$.

Oxygen as a primary working gas is chosen for this process example, due to the fact that its atomic mass (16 Atomic Units) is very close to the atomic mass of carbon (12 Atomic Units), and consequently transfer of the momentum from atomic oxygen to atomic carbon is close to its maximum possible value in the process of an atomic oxygen impact with the atomic carbon. That closeness is important for cleaning surfaces of organic residues. The second reason for this choice is formation of only gaseous fugitive products with chemical reactions of the oxygen with the carbon: CO and $CO_2$, that is also an important feature for cleaning surfaces of the organic residues. The third reason for the choice is a high energy, 12.754 eV from ground state, of the metastable atomic oxygen level $2s^2 2p^3(^4S^*)4d$, term $^3D^*$, $J_k$=3, $g_k$=7, allowing effective destruction of the residues on the surface, and also existence of an acceptable life time $\tau_m$=0.00103 sec of this level allowing a simple physical separation of the neutral excited atomic oxygen medium from plasma. Here the life-time $\tau_m$=0.00103 sec is calculated as the inverse value of the transition probability $A_{ki}$=9.62×10$^2$ sec$^{-1}$. However the energy 12.754 eV necessary to elevate the electron up to mentioned level of atomic oxygen is almost unachievable for electrons of plasma generated in pure oxygen at relatively high gas pressures. Hence the probability of this process is very small in this case. To increase the rate of molecular oxygen transformation to the atomic form and further to the form of the atomic oxygen gaseous medium excited to metastable state, the secondary gas argon (Ar) is chosen for mixture with oxygen. The argon has an electron level with a configuration of $3s^2 3p^5(^2P^*_{3/2})4p$, term $^2[\frac{1}{2}]$ at J=1, with energy (from ground level) of 12.91 eV. This level has a very high rate of excitation in argon plasma produced by RF discharge in pure argon. A proximity of the energy at this level (with an important small excess) to the energy of the atomic oxygen level $2s^2 2p^3(^4S^*)4d$, term $^3D^*$, $J_k$=3, $g_k$=7, having energy of 12.754 eV, provides a high rate of irreversible resonant energy transition from this level to the atomic oxygen by binary Ar—O collisions, if a small percentage of the oxygen in the working mixture does not significantly change the electric characteristics of the discharge. This small percentage, merely ~2% of $O_2$ in the working mixture with Ar, providing optimum transformation of the oxygen to the form of the excited metastable medium, is found experimentally at specific conditions. In general, this percentage is varied in the range of 0.5%–10% depending on the conditions of a gas discharge, the flow velocity, and the gas pressure. The range of the working gas pressure is from several mTorr to several atmospheric pressures.

Although the invention has been shown in the form of a specific embodiment, it is understood that this embodiment was given only for purpose of illustration and that changes and modifications are possible, provided they do not depart from the scope of the appended claims. For example, a mixture of two or more excited mediums may be applied to a surface treatment, and an apparatus generating excited metastable medium may have differences from the original scheme shown in FIG. 2.

What I claim is:

1. A process for modification of a surface structure comprising:

producing an atomic or molecular gaseous medium excited to a metastable level by the process of blowing a working gaseous medium through a discharge gap filled with a plasma generated from said working gaseous medium, and separating said excited atomic or molecular gaseous medium from said plasma by forcing said working gaseous medium under pressure through said plasma for development of a flow velocity to separate said excited atomic or molecular gaseous medium from said plasma; and exposing said surface structure to a flow of said excited atomic or molecular gaseous medium.

2. The process of claim 1 including;

intensively cooling said excited atomic or molecular gaseous medium approximately to room temperature before the step of exposing.

3. The process of claim 1 wherein said working gaseous medium is comprised of an oxygen gas and argon gas mixture.

4. The process of claims 3 wherein said working gaseous medium is comprised of 2% oxygen gas and 98% argon gas.

5. The process of claim 1 wherein the pressure of said excited atomic or molecular gaseous medium for exposure to said surface is selected as one atmosphere.

* * * * *